US012777665B2

(12) United States Patent
Jin

(10) Patent No.: US 12,777,665 B2
(45) Date of Patent: Oct. 27, 2026

(54) SEMICONDUCTOR STRUCTURE AND FABRICATION METHOD THEREOF

(71) Applicant: Semiconductor Manufacturing International (Shanghai) Corporation, Shanghai (CN)

(72) Inventor: Jisong Jin, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 385 days.

(21) Appl. No.: 18/374,205

(22) Filed: Sep. 28, 2023

(65) Prior Publication Data

US 2024/0113157 A1 Apr. 4, 2024

(30) Foreign Application Priority Data

Sep. 30, 2022 (CN) ......................... 202211211339.7

(51) Int. Cl.
*H10D 1/68* (2025.01)
*H10P 14/40* (2026.01)
*H10P 50/00* (2026.01)

(52) U.S. Cl.
CPC ............. *H10D 1/692* (2025.01); *H10P 14/40* (2026.01); *H10P 50/00* (2026.01)

(58) Field of Classification Search
CPC .......... H10D 1/692; H10P 14/40; H10P 50/00
See application file for complete search history.

(56) References Cited

U.S. PATENT DOCUMENTS

| | | | | |
|---|---|---|---|---|
| 10,840,324 B2* | 11/2020 | Wu | .......................... | H10D 1/68 |
| 2020/0075709 A1* | 3/2020 | Wu | .......................... | H10D 1/68 |
| 2021/0083041 A1* | 3/2021 | Wu | .......................... | H10D 1/68 |
| 2023/0411444 A1* | 12/2023 | Jin | ......................... | H10D 1/684 |
| 2024/0096928 A1* | 3/2024 | Yeong | ....................... | H01G 4/20 |
| 2024/0274652 A1* | 8/2024 | Wang | ..................... | H10D 1/696 |
| 2025/0040159 A1* | 1/2025 | Jin | ......................... | H10D 1/692 |

* cited by examiner

*Primary Examiner* — Richard A Booth
(74) *Attorney, Agent, or Firm* — Anova Law Group, PLLC

(57) ABSTRACT

A semiconductor structure includes a substrate that includes a first region, a second region, and a third region; a first electrode layer disposed over the first region and the second region; a first dielectric layer disposed over the substrate; a second electrode layer disposed on the first dielectric layer over the third region and the second region; a second dielectric layer disposed over the substrate; a third electrode layer disposed on the second dielectric layer over the second region and over a portion of each of the third and first regions; and a first plug disposed over the first region and a second plug disposed over the third region. The first plug is electrically connected with one of the first, second and third electrode layers, and the second plug is electrically connected with the other two electrode layers.

20 Claims, 5 Drawing Sheets

SEMICONDUCTOR STRUCTURE AND FABRICATION METHOD THEREOF

CROSS-REFERENCES TO RELATED APPLICATIONS

This application claims the priority of Chinese patent application No. 202211211339.7, filed on Sep. 30, 2022, the entirety of which is incorporated herein by reference.

FIELD OF THE DISCLOSURE

The present disclosure generally relates to the field of semiconductor manufacturing technology and, more particularly, relates to a semiconductor structure and a fabrication method thereof.

BACKGROUND

A metal-insulator-metal (MIM) capacitor, an energy storage device with high energy storage capacity, has been widely used in radio frequency decoupling and analog mixed-signal integrated circuits. The storage energy density of a capacitor is often directly proportional to the capacitance density. Therefore, high-density capacitance is crucial for the metal-insulator-metal capacitor. The disclosed methods and device structures are directed to increase the capacitance density.

BRIEF SUMMARY OF THE DISCLOSURE

One aspect of the present disclosure includes a semiconductor structure. The semiconductor structure includes a substrate. The substrate includes a first region, a second region, and a third region, and the second region is located between the first region and the third region. The semiconductor structure also includes a first electrode layer disposed over the first region and the second region; and a first dielectric layer disposed on a top surface and sidewall surfaces of the first electrode layer as well as on a surface of the third region. In addition, the semiconductor structure includes a second electrode layer disposed on a surface of the first dielectric layer over the third region and the second region, where the second electrode layer exposes the first electrode layer over the first region; and a second dielectric layer disposed on a top surface and sidewall surfaces of the second electrode layer as well as over a surface of the first electrode layer over the first region. Moreover, the semiconductor structure includes a third electrode layer disposed on a surface of the second dielectric layer. The third electrode layer is located over the second region and is extended to a portion of each of the third region and the first region, and the third electrode layer exposes a portion of the first electrode layer over the first region and a portion of the second electrode layer over the third region. Further, the semiconductor structure includes a first plug disposed over the first region and a second plug disposed over the third region. The first plug is electrically connected with the first electrode layer and the third electrode layer, and the second plug is electrically connected with the second electrode layer. Alternatively, the first plug is electrically connected with the first electrode layer, and the second plug is electrically connected with the second electrode layer and the third electrode layer.

Optionally, the first dielectric layer is made of a material including a dielectric material, and the dielectric material includes hafnium oxide or aluminum oxide. The second dielectric layer is made of a material including a dielectric material, and the dielectric material includes hafnium oxide or aluminum oxide.

Optionally, the first electrode layer is made of a material including a metal, the second electrode layer is made of a material including a metal, and the third electrode layer is made of a material including a metal. The metal includes one or more of copper, aluminum, tungsten, cobalt, nickel, and tantalum.

Optionally, the semiconductor structure further includes an etch stop layer disposed between the first electrode layer and the substrate, and the etch stop layer is made of a material including silicon nitride.

Optionally, a thickness of the first dielectric layer is in a range approximately between 30 Å and 100 Å. A thickness of the second dielectric layer is in a range approximately between 30 Å and 100 Å.

Optionally, the semiconductor structure further includes a dielectric structure disposed over the substrate. The first electrode layer, the second electrode layer, and the third electrode layer are located in the dielectric structure. The dielectric structure includes a first opening over the first region and a second opening over the third region. The first opening exposes a portion of the surface of the first electrode layer and a portion of the surface of the third electrode layer, and the second opening exposes a portion of the surface of the second electrode layer. Alternatively, the first opening exposes a portion of the surface of the first electrode layer, and the second opening exposes a portion of the surface of the second electrode layer and a portion of the surface of the third electrode layer. The first plug is located in the first opening, and the second plug is located in the second opening.

Optionally, the first plug includes a first adhesion layer on sidewall and bottom surfaces of the first opening, and a first metal layer on the first adhesion layer. The second plug includes a second adhesion layer on sidewall and bottom surfaces of the second opening, and a second metal layer on the second adhesion layer.

Another aspect of the present disclosure includes a fabrication method of a semiconductor structure. The method includes providing a substrate, where the substrate includes a first region, a second region, and a third region, and the second region is located between the first region and the third region. The method also includes forming a first electrode layer over the first region and the second region; and forming a first dielectric layer on a top surface and sidewall surfaces of the first electrode layer as well as on a surface of the third region. In addition, the method includes forming a second electrode layer on a surface of the first dielectric layer over the third region and the second region, where the second electrode layer exposes the first electrode layer over the first region; and forming a second dielectric layer on a top surface and sidewall surfaces of the second electrode layer as well as over a surface of the first electrode layer over the first region. Moreover, the method includes forming a third electrode layer on a surface of the second dielectric layer. The third electrode layer is located over the second region and is extended to a portion of each of the third region and the first region, and the third electrode layer exposes a portion of the first electrode layer over the first region and a portion of the second electrode layer over the third region. Further, the method includes forming a first plug over the first region and forming a second plug over the third region. The first plug is electrically connected with the first electrode layer and the third electrode layer, and the second plug is electrically connected with the second electrode layer. Alternatively, the first plug is electrically connected with the first electrode layer, and the second plug is electrically connected with the second electrode layer and the third electrode layer.

Optionally, the first dielectric layer is made of a material including a dielectric material, and the dielectric material includes hafnium oxide or aluminum oxide. The second dielectric layer is made of a material including a dielectric material, and the dielectric material includes hafnium oxide or aluminum oxide.

Optionally, the first electrode layer is made of a material including a metal, the second electrode layer is made of a material including a metal, and the third electrode layer is made of a material including a metal. The metal includes one or more of copper, aluminum, tungsten, cobalt, nickel, and tantalum.

Optionally, before forming the first electrode layer, the method further includes forming an etch stop layer over the substrate.

Optionally, the etch stop layer is made of a material including silicon nitride.

Optionally, a thickness of the first dielectric layer is in a range approximately between 30 Å and 100 Å. A thickness of the second dielectric layer is in a range approximately between 30 Å and 100 Å.

Optionally, forming the first electrode layer includes: forming an electrode material layer over the substrate, and removing the electrode material layer over the third region to form the first electrode layer over the first region and the second region.

Optionally, forming the second electrode layer on the surface of the first dielectric layer over the third region and the second region includes: forming an electrode material layer on the surface of the first dielectric layer, and removing the electrode material layer over the first region to form the second electrode layer on the surface of the first dielectric layer over the second region and the third region.

Optionally, forming the third electrode layer includes: forming an electrode material layer on the surface of the second dielectric layer, and removing a portion of the electrode material layer over the first region and a portion of the electrode material layer over the third region, to form the third electrode layer over the second region and over a portion of each of the first region and the third region.

Optionally, the first plug and the second plug are simultaneously formed.

Optionally, forming the first plug and the second plug includes: forming a dielectric structure over the substrate, where the first electrode layer, the second electrode layer, and the third electrode layer are located in the dielectric structure; and forming a first opening in the dielectric structure over the first region, and forming a second opening in the dielectric structure over the third region. The first opening exposes a portion of the surface of the first electrode layer and a portion of the surface of the third electrode layer, and the second opening exposes a portion of the surface of the second electrode layer. Alternatively, the first opening exposes a portion of the surface of the first electrode layer, and the second opening exposes a portion of the surface of the second electrode layer and a portion of the surface of the third electrode layer. Forming the first plug and the second plug also includes forming the first plug in the first opening, and forming the second plug in the second opening.

Optionally, the first plug includes a first adhesion layer on sidewall and bottom surfaces of the first opening, and a first metal layer on the first adhesion layer. The second plug includes a second adhesion layer on sidewall and bottom surfaces of the second opening, and a second metal layer on the second adhesion layer.

The disclosed embodiments may have following beneficial effects. In the disclosed semiconductor structure, by stacking electrode layers with different areas and different numbers of layers over the first region I, the second region II, and the third region III, respectively, and then using plugs formed in the dielectric structure 207 to electrically connect any layer of the electrode layers, the substantially high equivalent capacitance density may be achieved, which may meet the requirements for high capacitance or low capacitance. The fabrication process may be simple and may be achieved on a single side of the substrate, which may improve the production efficiency.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts.

Figure 1:
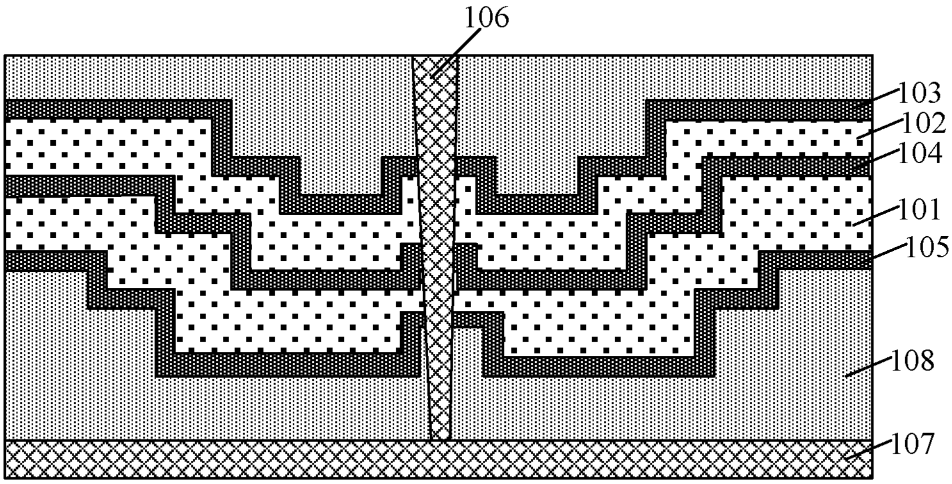
FIG. 1 illustrates a schematic diagram of a semiconductor structure.

FIG. 1 illustrates a schematic diagram of a semiconductor structure. A traditional metal-insulator-metal (MIM) capacitor structure consists of a single dielectric layer, and the equivalent capacitance density of the capacitor is limited by the thickness and dielectric constant of the dielectric layer.

To achieve a higher equivalent capacitance density, a capacitor structure shown in FIG. 1 is proposed. The capacitor structure includes: a dielectric structure 108; a first electrode layer 103, a second electrode layer 104, and a third electrode layer 105 disposed in the dielectric structure 108; a first dielectric layer 102 disposed between the first electrode layer 103 and the second electrode layer 104; a second dielectric layer 101 disposed between the second electrode layer 104 and the third electrode layer 105; a metal layer 107 on the surface of the dielectric structure 108; and a conductive plug 106 that penetrates through the first electrode layer 103, the second electrode layer 104, and the third electrode layer 105. The conductive plug 106 is electrically connected to the metal layer 107.

In the capacitor structure, the first electrode layer 103, the second electrode layer 104 and the first dielectric layer 102 form a first capacitor, and the second electrode layer 104, the third electrode layer 105 and the second dielectric layer 101 form a second capacitor. The conductive plug 106 penetrates through the first capacitor and the second capacitor. The conductive plug 106 divides the first capacitor into two first sub-capacitors and divides the second capacitor into two second sub-capacitors. By controlling the electrical connection between the conductive plug 106 and each of the first electrode layer 103, the second electrode layer 104, and the third electrode layer 105 on both sides of the conductive plug 106, the two first sub-capacitors and the two second sub-capacitors can be controlled to be connected in series or parallel, to enhance the equivalent capacitance density.

However, the formation of the conductive plug 106 requires penetrating through the entire capacitor structure, making the manufacturing process substantially complex. In addition, the process window for controlling the electrical connection relationship between the conductive plug 106 and each of the first electrode layer 103, the second electrode layer 104, and the third electrode layer 105 on both sides of the conductive plug 106 is substantially small, which is not conducive to large-scale production.

To solve the above issues, the present disclosure provides a semiconductor structure and a fabrication method of a semiconductor structure. By stacking electrode layers with different areas and different numbers of layers over a first region, a second region, and a third region, respectively, and then using plugs formed in a dielectric structure to electrically connect any layer of the electrode layers, series or parallel connections of arbitrary electrode layers may be achieved, which may enable the substantially high equivalent capacitance density and may meet the requirements for high capacitance or low capacitance. The fabrication process may be simple and may be achieved on a single side of the substrate, which may improve the production efficiency.

Figure 10:
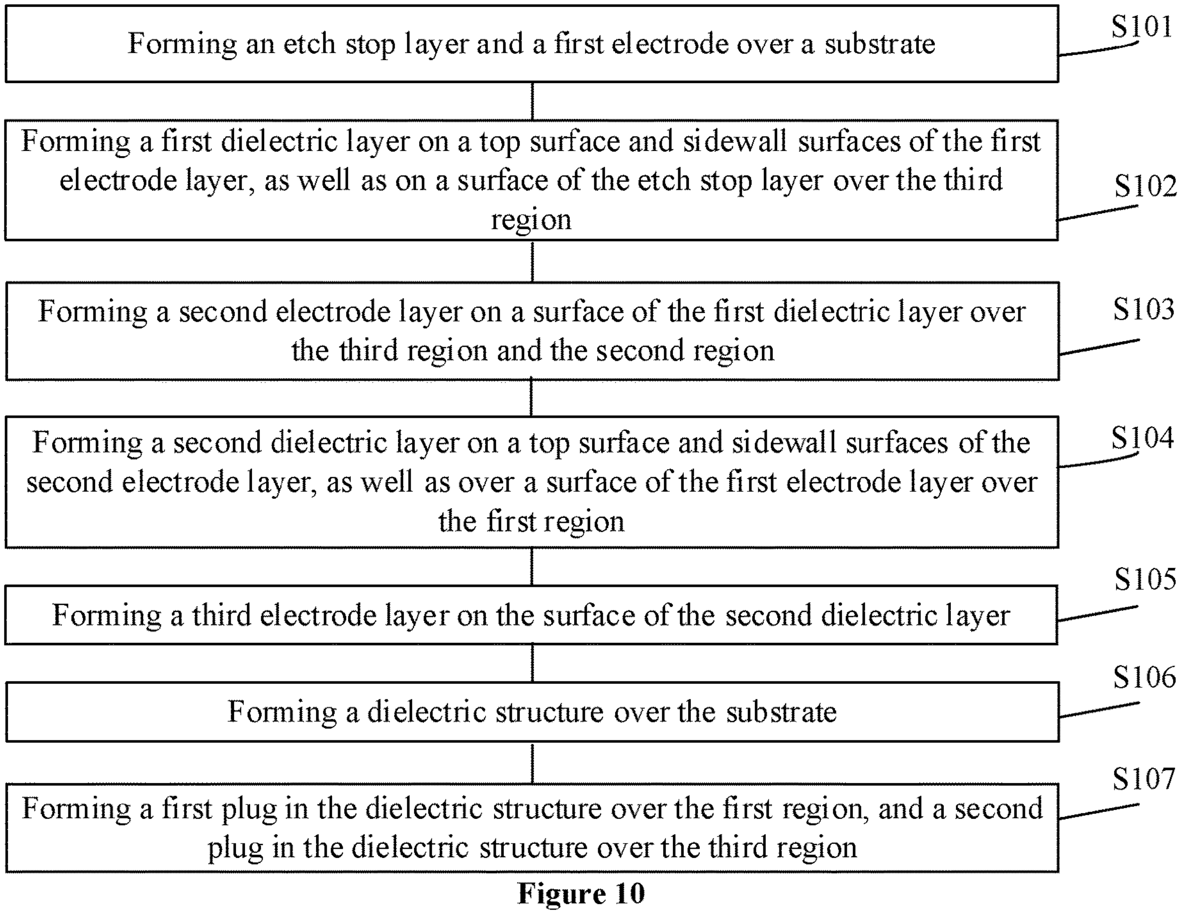
FIG. 10 illustrates a flowchart of an exemplary method for forming a semiconductor structure consistent with various disclosed embodiments of the present disclosure.

FIG. 10 illustrates a flowchart of a method for forming a semiconductor structure consistent with various disclosed embodiments of the present disclosure, and FIGS. 2-8 illustrate semiconductor structures corresponding to certain stages of the fabrication method.

Figure 2:
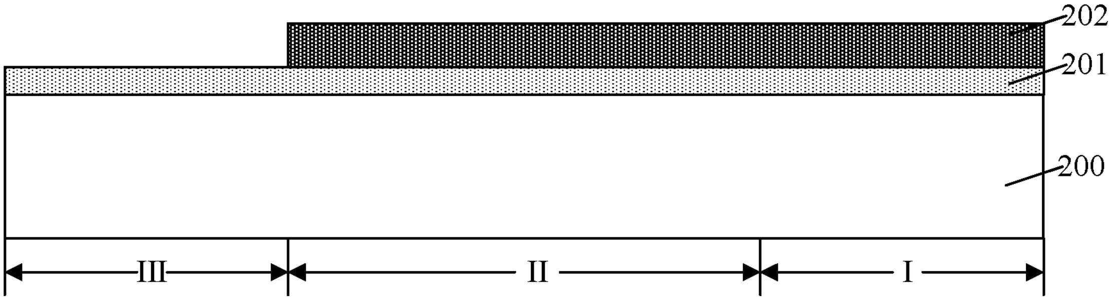
FIGS. 2-8 illustrate semiconductor structures corresponding to certain stages for forming an exemplary semiconductor structure consistent with various disclosed embodiments of the present disclosure.

As shown in FIG. 10, at the beginning of the fabrication method, an etch stop layer and a first electrode may be formed over a substrate (S101). FIG. 2 illustrates a corresponding semiconductor structure.

Referring to FIG. 2, a substrate 200 may be provided. The substrate 200 may include a first region I, a second region II, and a third region III. The second region II may be located between the first region I and the third region III.

In one embodiment, the substrate 200 may be made of a material including silicon. In certain embodiments, the substrate may be made of a material including silicon carbide, silicon germanium, a multi-component semiconductor material composed of Group III-V elements, silicon-on-insulator (SOI), or germanium-on-insulator (GOI), etc. The multi-component semiconductor material composed of Group III-V elements may include InP, GaAs, GaP, InAs, InSb, InGaAs, or InGaAsP, etc.

In certain embodiments, the substrate may include a base and a device layer on the base. The device layer may include an isolation structure and a device structure located in the isolation structure. The device structure may include a transistor, a diode, a triode, a capacitor, an inductor, or a conductive structure, etc.

Referring to FIG. 2, an etch stop layer 201 may be formed on the substrate 200. In one embodiment, the etch stop layer 201 may be made of silicon nitride.

Referring to FIG. 2, a first electrode layer 202 may be formed on a portion of the etch stop layer 201 over the first region I and the second region II. The first electrode layer 202 may be made of a metal, and the metal may include one or more of copper, aluminum, tungsten, cobalt, nickel, and tantalum.

Forming the first electrode layer 202 may include: forming an electrode material layer (not illustrated) over the substrate 200, and removing the electrode material layer over the third region III to form the first electrode layer 202 over the first region I and the second region II. The formation process of the electrode material layer may include an electroplating process or a chemical deposition process.

Figure 3:
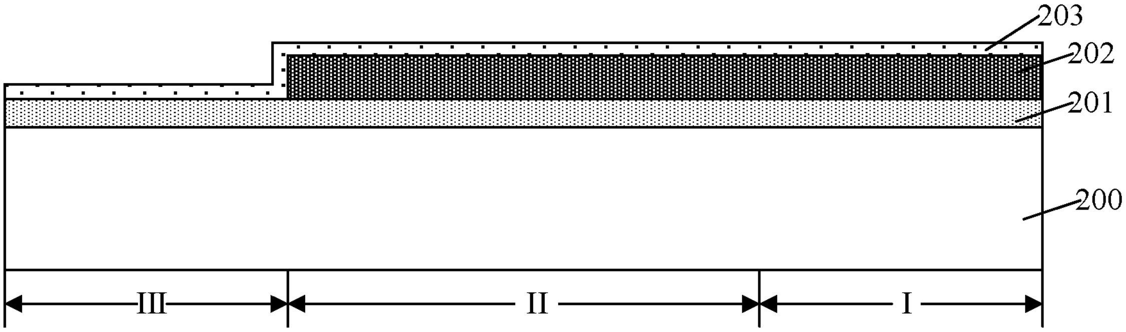

Returning to FIG. 10, after forming the first electrode layer, a first dielectric layer may be formed on a top surface and sidewall surfaces of the first electrode layer, as well as on a surface of the etch stop layer over the third region (S102). FIG. 3 illustrates a corresponding semiconductor structure.

Referring to FIG. 3, a first dielectric layer 203 may be formed on a top surface and sidewall surfaces of the first electrode layer 202, as well as on a surface of the etch stop layer 201 over the third region III.

The first dielectric layer 203 may be made of a material including a dielectric material, and the dielectric material may include hafnium oxide or aluminum oxide. The formation process of the first dielectric layer 203 may include a deposition process. A thickness of the first dielectric layer 203 may be in a range approximately between 30 Å and 100 Å.

Figure 4:
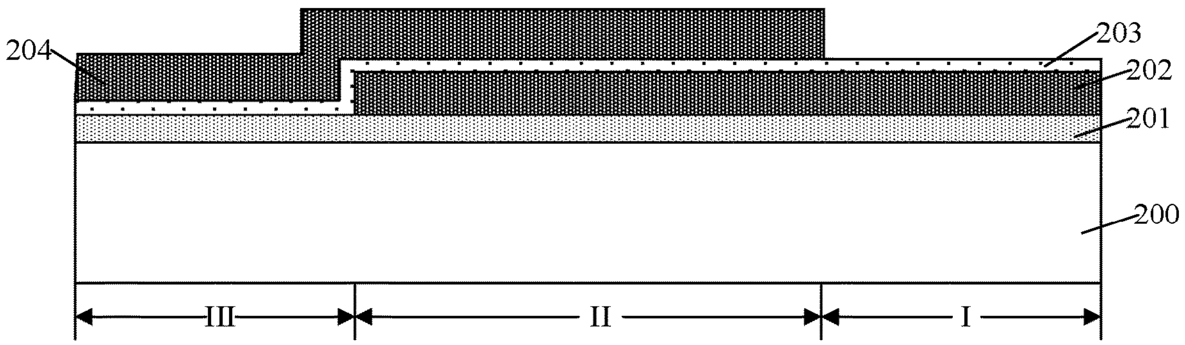

Returning to FIG. 10, after forming the first dielectric layer, a second electrode layer may be formed on a surface of the first dielectric layer over the third region and the second region (S103). FIG. 4 illustrates a corresponding semiconductor structure.

Referring to FIG. 4, a second electrode layer 204 may be formed on a surface of the first dielectric layer 203 over the third region III and the second region II. The second electrode layer 204 may expose the first electrode layer 202 over the first region I.

In one embodiment, the second electrode layer 204 may expose the surface of the first dielectric layer 203 over the first region I. The second electrode layer 204 may be made of a metal, and the metal may include one or more of copper, aluminum, tungsten, cobalt, nickel, and tantalum.

Forming the second electrode layer 204 on the surface of the first dielectric layer 203 over the third region III and the second region II may include: forming an electrode material layer (not shown) on the surface of the first dielectric layer 203; and removing the electrode material layer over the first region I to form the second electrode layer 204 on the surface of the first dielectric layer 203 over the third region III and the second region II. The formation process of the electrode material layer may include an electroplating process or a chemical deposition process.

Figure 5:
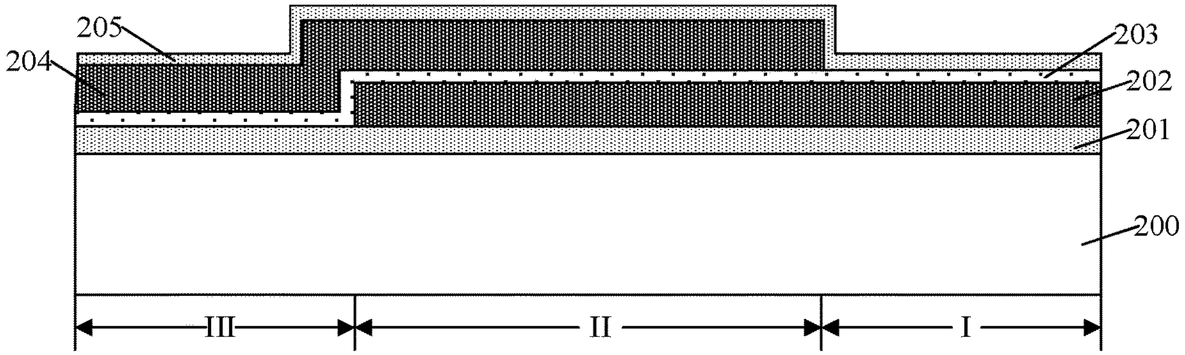

Returning to FIG. 10, after forming the second electrode layer, a second dielectric layer may be formed on a top surface and sidewall surfaces of the second electrode layer, as well as over a surface of the first electrode layer over the first region (S104). FIG. 5 illustrates a corresponding semiconductor structure.

Referring to FIG. 5, a second dielectric layer 205 may be formed on a top surface and sidewall surfaces of the second electrode layer 204, as well as over a surface of the first electrode layer 202 over the first region I.

In one embodiment, the second dielectric layer 205 may be located on the top surface and the sidewall surfaces of the second electrode layer 204, and on the surface of the first dielectric layer 203 over the first region I.

The second dielectric layer 205 may be made of a material including a dielectric material, and the dielectric material may include hafnium oxide or aluminum oxide. The formation process of the second dielectric layer 205 may include a deposition process. A thickness of the second dielectric layer 205 may be in a range approximately between 30 Å and 100 Å.

Figure 6:
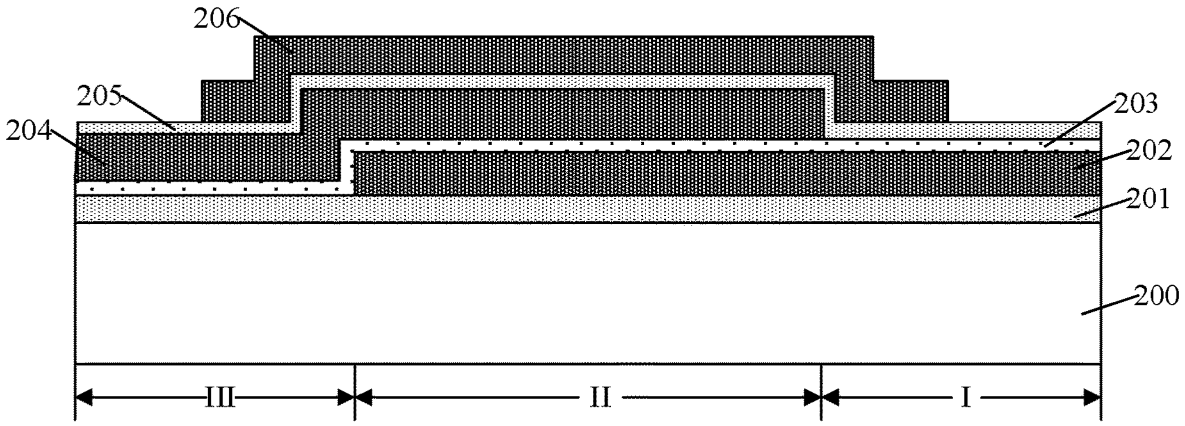

Returning to FIG. 10, after forming the second dielectric layer, a third electrode layer may be formed on the surface of the second dielectric layer (S105). FIG. 6 illustrates a corresponding semiconductor structure.

Referring to FIG. 6, a third electrode layer 206 may be formed on the surface of the second dielectric layer 205. The third electrode layer 206 may be located over the second region II, and may be extended to a portion of each of the third region III and the first region I. The third electrode layer 206 may expose a portion of the first electrode layer 202 over the first region I and a portion of the second electrode layer 204 over the third region III.

In one embodiment, the third electrode layer 206 may expose a portion of the surface of the second dielectric layer 205 over the first region I, and may expose a portion of the surface of the second dielectric layer 205 over the third region III.

In one embodiment, the third electrode layer 206 may be made of a metal, and the metal may include one or more of copper, aluminum, tungsten, cobalt, nickel, and tantalum.

Forming the third electrode layer 206 may include: forming an electrode material layer (not shown) on the surface of the second dielectric layer 205; and removing the electrode material layer over a portion of the first region I and the electrode material layer over a portion of the third region III, to form the third electrode layer 206 over the second region II, over a portion of the first region I and over a portion of the third region III. The formation process of the electrode material layer may include an electroplating process or a chemical deposition process.

Figure 7:
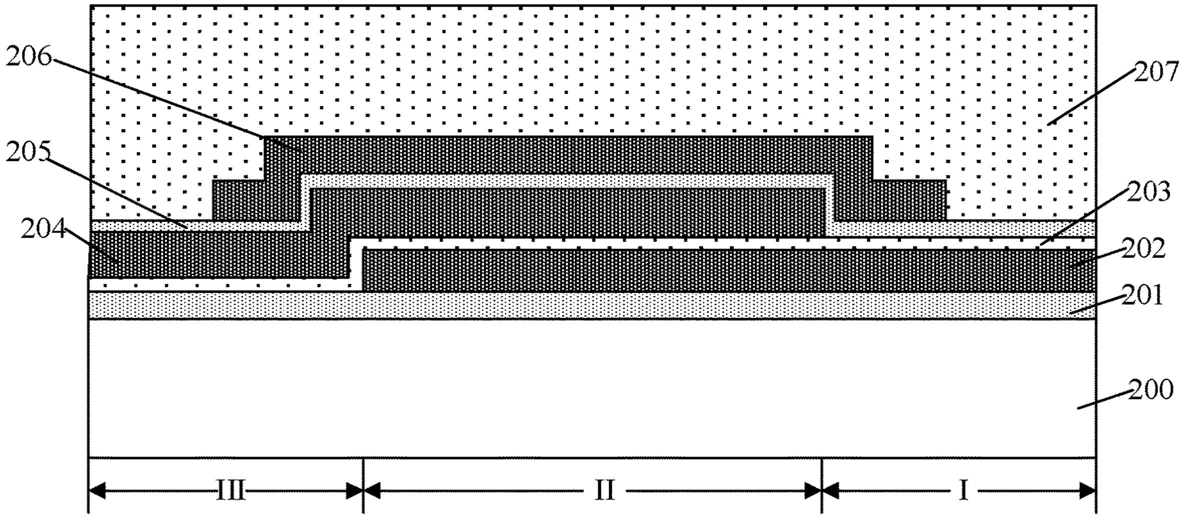

Returning to FIG. 10, after forming the third electrode layer, a dielectric structure may be formed over the substrate (S106). FIG. 7 illustrates a corresponding semiconductor structure.

Referring to FIG. 7, a dielectric structure 207 may be formed over the substrate 200. The first electrode layer 202, the second electrode layer 204, and the third electrode layer 206 may be located in the dielectric structure 207.

The dielectric structure 207 may be made of a material including a dielectric material, and the dielectric material may include one or more of silicon oxide, silicon nitride, silicon carbide, silicon oxycarbide, silicon oxynitride, aluminum oxide, aluminum nitride, silicon carbonitride, and silicon carb-oxy-nitride. In one embodiment, the dielectric structure 207 may be made of a material including silicon oxide.

Figure 8:
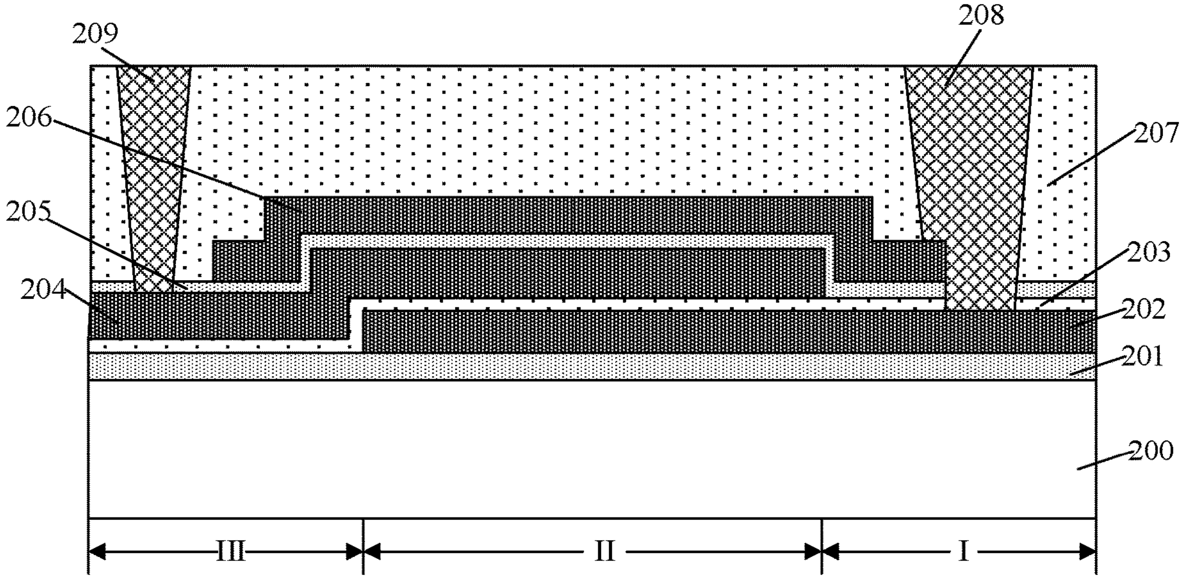

Returning to FIG. 10, after forming the dielectric structure, a first plug may be formed over the first region, and a second plug may be formed over the third region (S107). FIG. 8 illustrates a corresponding semiconductor structure.

Referring to FIG. 8, a first plug 208 may be formed over the first region I, and a second plug 209 may be formed over the third region III. The first plug 208 may be electrically connected with the first electrode layer 202 and the third electrode layer 206, and the second plug 209 may be electrically connected with the second electrode layer 204.

In one embodiment, the third electrode layer 206, the second dielectric layer 205, and second electrode layer 204 may form a first capacitor. The first electrode layer 202, the first dielectric layer 203, and the second electrode layer 204 may form a second capacitor. The first plug 208 may be electrically connected with the first electrode layer 202 and the third electrode layer 206, and the second plug 209 may be electrically connected with the second electrode layer 204, which may be equivalent to connecting the first capacitor and the second capacitor in parallel, to achieve an equivalent high-capacitance density structure.

The first plug 208 and the second plug 209 may be configured for electrical connection with external circuits. In one embodiment, the first plug 208 and the second plug 209 may be formed simultaneously.

Forming the first plug 208 and the second plug 209 may include: forming a first opening (not shown) in the dielectric structure 207 over the first region I and a second opening (not shown) in the dielectric structure 207 over the third region III, where the first opening may expose a portion of the surface of the first electrode layer 202 and a portion of the surface of the third electrode layer 206, and the second opening may expose a portion of the surface of the second electrode layer 204; and forming the first plug 208 in the first opening and the second plug 209 in the second opening.

The first plug 208 may include a first adhesion layer (not shown) on the sidewall and bottom surfaces of the first opening, and a first metal layer (not shown) on the first adhesion layer. The second plug 209 may include a second adhesion layer (not shown) on the sidewall and bottom surfaces of the second opening, and a second metal layer (not shown) on the second adhesion layer.

The first adhesion layer and the second adhesion layer may be made of a material including metal nitride, and the metal nitride may include one or more of tantalum nitride and titanium nitride.

The first metal layer and the second metal layer may be made of a material including metal, and the metal may include one or more of copper, aluminum, tungsten, cobalt, nickel, and tantalum.

In the semiconductor structure, by stacking electrode layers with different areas and different numbers of layers over the first region I, the second region II, and the third region III, respectively, and then using plugs formed in the dielectric structure 207 to electrically connect any layer of the electrode layers, the substantially high equivalent capacitance density may be achieved, which may meet the requirements for high capacitance or low capacitance. The fabrication process may be simple and may be achieved on a single side of the substrate, which may improve the production efficiency.

Accordingly, the present disclosure provides a semiconductor structure. Referring to FIG. 8, the semiconductor structure may include a substrate 200. The substrate 200 may include a first region I, a second region II, and a third region III. The second region II may be located between the first region I and the third region III. The semiconductor structure may also include a first electrode layer 202 disposed over the first region I and the second region II, and a first dielectric layer 203 disposed on a top surface and sidewall surfaces of the first electrode layer 202, as well as on a surface of the third region III. In addition, the semiconductor structure may include a second electrode layer 204 disposed on the surface of the first dielectric layer 203 over the third region III and the second region II, where the second electrode layer 204 may expose the first electrode layer 202 over the first region I. Moreover, the semiconductor structure may include a second dielectric layer 205 disposed on a top surface and sidewall surfaces of the second electrode layer 204 as well as over a surface of the first electrode layer 202 over the first region I. Further, the semiconductor structure may include a third electrode layer 206 disposed on the surface of the second dielectric layer 205. The third electrode layer 206 may be located over the second region II, and may be extended to a portion of each of the third region III and the first region I. The third electrode layer 206 may expose a portion of the first electrode layer 202 over the first region I and a portion of the second electrode layer 204 over the third region III. Furthermore, the semiconductor structure may include a first plug 208 disposed over the first region I, and a second plug 209 disposed over the third region III. The first plug 208 may be electrically connected with the first electrode layer 202 and the third electrode layer 206, and the second plug 209 may be electrically connected with the second electrode layer 204.

The first dielectric layer 203 may be made of a material including a dielectric material, and the dielectric material may include hafnium oxide or aluminum oxide. The second dielectric layer 205 may be made of a material including a dielectric material, and the dielectric material may include hafnium oxide or aluminum oxide.

The first electrode layer 202 may be made of a metal, the second electrode layer 204 may be made of a metal, and the third electrode layer 206 may be made of a metal. The metal may include one or more of copper, aluminum, tungsten, cobalt, nickel, and tantalum.

In one embodiment, the semiconductor structure may further include an etch stop layer 201 disposed between the first electrode layer 202 and the substrate 200. The etch stop layer 201 may be made of a material including silicon nitride.

A thickness of the first dielectric layer 203 may be in a range approximately between 30 Å and 100 Å. A thickness of the second dielectric layer 205 may be in a range approximately between 30 Å and 100 Å.

In one embodiment, the semiconductor structure may further include a dielectric structure 207 disposed over substrate 200. The first electrode layer 202, the second electrode layer 204, and the third electrode layer 206 may be located in the dielectric structure 207. A first opening may be formed in the dielectric structure 207 over the first region I, and a second opening may be formed in the dielectric structure 207 over the third region III. The first opening may expose a portion of the surface of the first electrode layer 202 and a portion of the surface of the third electrode layer 206, and the second opening may expose a portion of the surface of the second electrode layer 204. The first plug 208 may be located in the first opening, and the second plug 209 may be located in the second opening.

In one embodiment, the first plug 208 may include a first adhesion layer on the sidewall and bottom surfaces of the first opening, and a first metal layer on the first adhesion layer. The second plug 209 may include a second adhesion layer on the sidewall and bottom surfaces of the second opening, and a second metal layer on the second adhesion layer.

Figure 9:
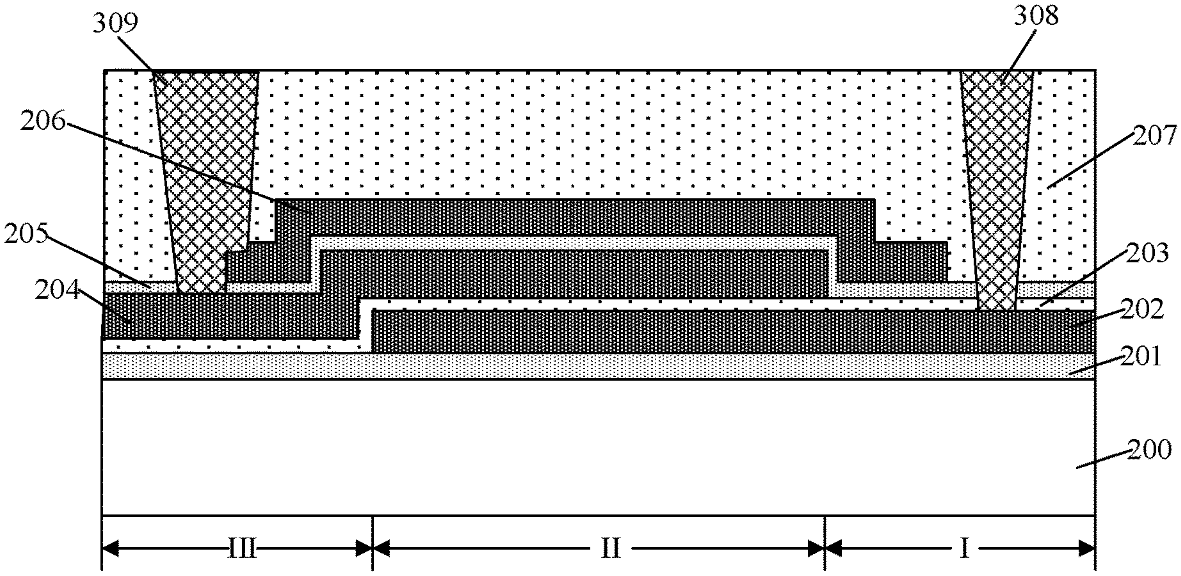
FIG. 9 illustrates a schematic diagram of another exemplary semiconductor structure consistent with various disclosed embodiments of the present disclosure.

FIG. 9 illustrates a schematic diagram of another semiconductor structure consistent with various disclosed embodiments of the present disclosure. The difference between the semiconductor structure shown in FIG. 9 and the semiconductor structure shown in FIG. 8 may include that a first plug 308 may be electrically connected with the first electrode layer 202, and a second plug 309 may be electrically connected with the second electrode layer 204 and the third electrode layer 206.

In one embodiment, the third electrode layer 206, the second dielectric layer 205, and the second electrode layer 204 may form a first capacitor. The first electrode layer 202, the first dielectric layer 203, and the second electrode layer 204 may form a second capacitor. The first plug 308 may be electrically connected with the first electrode layer 202, and the second plug 309 may be electrically connected with the second electrode layer 204 and the third electrode layer 206, which may be equivalent to short-circuiting the second electrode layer 204 and the third electrode layer 206. In view of this, the capacitor structure may merely include the second capacitor formed by the first electrode layer 202, the first dielectric layer 203 and the second electrode layer 204, to achieve an equivalent low capacitance structure.

Forming the first plug 308 and the second plug 309 may include: forming a first opening (not shown) in the dielectric structure 207 over the first region I and a second opening (not shown) in the dielectric structure 207 over the third region III, where the first opening may expose a portion of the surface of the first electrode layer 202, and the second opening may expose a portion of the surface of the second electrode layer 204 and a portion of the surface of the third electrode layer 206; and forming the first plug 308 in the first opening and the second plug 309 in the second opening.

The disclosed embodiments may have following beneficial effects. In the disclosed semiconductor structure, by stacking electrode layers with different areas and different numbers of layers over the first region I, the second region II, and the third region III, respectively, and then using plugs formed in the dielectric structure 207 to electrically connect any layer of the electrode layers, the substantially high equivalent capacitance density may be achieved, which may meet the requirements for high capacitance or low capacitance. The fabrication process may be simple and may be achieved on a single side of the substrate, which may improve the production efficiency.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A semiconductor structure, comprising:

a substrate, wherein the substrate includes a first region, a second region, and a third region, and the second region is located between the first region and the third region;

a bottom dielectric layer disposed over the first region, the second region, and the third region of the substrate;

a first electrode layer disposed over a first portion of the bottom dielectric layer above the first region and the second region;

a first dielectric layer disposed on a top surface and sidewall surfaces of the first electrode layer and over a second portion of the bottom dielectric layer above the third region;

a second electrode layer disposed on a surface of the first dielectric layer over the third region and the second region, wherein the second electrode layer does not cover a surface of the first dielectric layer over the first region;

a second dielectric layer disposed on a top surface and sidewall surfaces of the second electrode layer as well as over the surface of the first dielectric layer over the first region;

a third electrode layer disposed on a surface of the second dielectric layer, wherein the third electrode layer is located over the second region and is extended to a portion of each of the third region and the first region, and the third electrode layer does not overlap a portion of the first electrode layer over the first region and a portion of the second electrode layer over the third region; and a first plug disposed over the first region and a second plug disposed over the third region, wherein:

the first plug is arranged above and electrically connected with the first electrode layer;

the second plug is arranged above and electrically connected with the second electrode layer;

the first electrode layer and the first portion of the bottom dielectric layer are arranged between a bottom of the first plug and the substrate;

the second electrode layer, the first dielectric layer, and the second portion of the bottom dielectric layer are arranged between a bottom of the second plug and the substrate;

the first dielectric layer is arranged below the bottom of the second plug and the second electrode layer, above the first electrode layer, and surrounding the bottom of the first plug; and the third electrode layer is electrically connected with the first plug or the second plug.

2. The semiconductor structure according to claim 1, wherein:

the first dielectric layer is made of a first material including a first dielectric material, and the first dielectric material includes hafnium oxide or aluminum oxide; and the second dielectric layer is made of a second material including a second dielectric material, and the second dielectric material includes hafnium oxide or aluminum oxide.

3. The semiconductor structure according to claim 1, wherein:

the first electrode layer is made of a first material including a first metal, the second electrode layer is made of a second material including a second metal, and the third electrode layer is made of a third material including a third metal, wherein the first metal, the second metal, and the third metal each include one or more of copper, aluminum, tungsten, cobalt, nickel, and tantalum.

4. The semiconductor structure according to claim 1, wherein the bottom dielectric layer includes an etch stop layer, and the etch stop layer is made of a material including silicon nitride.

5. The semiconductor structure according to claim 1, wherein:

a thickness of the first dielectric layer is in a range approximately between 30 Å and 100 Å; and a thickness of the second dielectric layer is in a range approximately between 30 Å and 100 Å.

6. The semiconductor structure according to claim 1, further including:

a dielectric structure disposed over the substrate, wherein:

the first electrode layer, the second electrode layer, the third electrode layer, the first plug, and the second plug are located in the dielectric structure;

the bottom of the first plug contacts the top surface of the first electrode layer;

the bottom of the second plug contacts the top surface of the second electrode layer;

when the third electrode layer is electrically connected with the first plug, a part of the first plug contacts a surface of the third electrode layer; and when the third electrode layer is electrically connected with the second plug, a portion of the first plug contacts a another surface of the third electrode layer.

7. The semiconductor structure according to claim 1, wherein:

when the third electrode layer is electrically connected with the first plug, a dimension of the first plug is larger than a dimension of the second plug in a plane parallel to the substrate; and when the third electrode layer is electrically connected with the second plug, the dimension of the second plug is larger than the dimension of the first plug in the plane parallel to the substrate.

8. A fabrication method of a semiconductor structure, comprising:

providing a substrate, wherein the substrate includes a first region, a second region, and a third region, and the second region is located between the first region and the third region;

forming a bottom dielectric layer over the first region, the second region, and the third region of the substrate;

forming a first electrode layer over a first portion of the bottom dielectric layer above the first region and the second region;

forming a first dielectric layer on a top surface and sidewall surfaces of the first electrode layer and over a second portion of the bottom dielectric layer above the third region;

forming a second electrode layer on a surface of the first dielectric layer over the third region and the second region, wherein the second electrode layer does not cover a surface of the first dielectric layer over the first region;

forming a second dielectric layer on a top surface and sidewall surfaces of the second electrode layer as well as over the surface of the first dielectric layer over the first region;

forming a third electrode layer on a surface of the second dielectric layer, wherein the third electrode layer is located over the second region and is extended to a portion of each of the third region and the first region, and the third electrode layer does not overlap a portion of the first electrode layer over the first region and a portion of the second electrode layer over the third region; and forming a first plug over the first region and forming a second plug over the third region, wherein:

the first plug is arranged above and electrically connected with the first electrode layer;

the second plug is arranged above and electrically connected with the second electrode layer;

the first electrode layer and the first portion of the bottom dielectric layer are arranged between a bottom of the first plug and the substrate;

the second electrode layer, the first dielectric layer, and the second portion of the bottom dielectric layer are arranged between a bottom of the second plug and the substrate;

the first dielectric layer is arranged below the bottom of the second plug and the second electrode layer, above the first electrode layer, and surrounding the bottom of the first plug; and the third electrode layer is electrically connected with the first plug or the second plug.

9. The fabrication method according to claim 8, wherein: the first dielectric layer is made of a first material including a first dielectric material, and the first dielectric material includes hafnium oxide or aluminum oxide; and the second dielectric layer is made of a second material including a second dielectric material, and the second dielectric material includes hafnium oxide or aluminum oxide.

10. The fabrication method according to claim 8, wherein: the first electrode layer is made of a first material including a first metal, the second electrode layer is made of a second material including a second metal, and the third electrode layer is made of a third material including a third metal, wherein the first metal, the second metal, and the third metal each include one or more of copper, aluminum, tungsten, cobalt, nickel, and tantalum.

11. The fabrication method according to claim 8, wherein: the bottom dielectric layer includes an etch stop layer over the substrate, and the etch stop layer is made of a material including silicon nitride.

12. The fabrication method according to claim 8, wherein: a thickness of the first dielectric layer is in a range approximately between 30 Å and 100 Å; and a thickness of the second dielectric layer is in a range approximately between 30 Å and 100 Å.

13. The fabrication method according to claim 8, wherein forming the first electrode layer includes:

forming an electrode material layer over the substrate, and removing the electrode material layer over the third region to form the first electrode layer over the first region and the second region.

14. The fabrication method according to claim 8, wherein forming the second electrode layer on the surface of the first dielectric layer over the third region and the second region includes:

forming an electrode material layer on the surface of the first dielectric layer, and removing the electrode material layer over the first region to form the second electrode layer on the surface of the first dielectric layer over the second region and the third region.

15. The fabrication method according to claim 8, wherein forming the third electrode layer includes:

forming an electrode material layer on the surface of the second dielectric layer, and removing a portion of the electrode material layer over the first region and a portion of the electrode material layer over the third region, to form the third electrode layer over the second region and over the portion of each of the first region and the third region.

16. The fabrication method according to claim 8, wherein: the first plug and the second plug are simultaneously formed, and forming the first plug and the second plug includes:

forming a dielectric structure over the substrate, wherein the first electrode layer, the second electrode layer, and the third electrode layer are located in the dielectric structure;

forming a first opening in the dielectric structure over the first region, and forming a second opening in the dielectric structure over the third region, wherein:

the first opening exposes a portion of the top surface of the first electrode layer and a portion of a surface of the third electrode layer, and the second opening exposes a portion of the top surface of the second electrode layer; or the first opening exposes a portion of the top surface of the first electrode layer, and the second opening exposes a portion of the top surface of the second electrode layer and a portion of a surface of the third electrode layer; and forming the first plug in the first opening, and forming the second plug in the second opening.

17. The fabrication method according to claim 8, wherein: when the third electrode layer is electrically connected with the first plug, a dimension of the first plug is larger than a dimension of the second plug in a plane parallel to the substrate; and when the third electrode layer is electrically connected with the second plug, the dimension of the second plug is larger than the dimension of the first plug in the plane parallel to the substrate.

18. A semiconductor structure, comprising:

a substrate, wherein the substrate includes a first region, a second region, and a third region, and the second region is located between the first region and the third region;

a bottom dielectric layer disposed over the first region, the second region, and the third region of the substrate;

a first electrode layer disposed over a first portion of the bottom dielectric layer above the first region and the second region;

a first dielectric layer disposed on a top surface and sidewall surfaces of the first electrode layer and over a second portion of the bottom dielectric layer above the third region;

a second electrode layer disposed on a surface of the first dielectric layer over the third region and the second region, wherein the second electrode layer does not cover a surface of the first dielectric layer over the first region;

a second dielectric layer disposed on a top surface and sidewall surfaces of the second electrode layer and over the surface of the first dielectric layer over the first region;

a third electrode layer disposed on a surface of the second dielectric layer, wherein the third electrode layer is located over the second region and is extended to a portion of each of the third region and the first region, and the third electrode layer does not overlap a portion of the first electrode layer over the first region and a portion of the second electrode layer over the third region; and a first plug disposed over the first region and a second plug disposed over the third region, wherein:

the first plug is arranged above and electrically connected with the first electrode layer;

the second plug is arranged above and electrically connected with the second electrode layer;

the first dielectric layer is arranged below a bottom of the second plug and the second electrode layer, above the first electrode layer, and surrounding a bottom of the first plug;

a level of the bottom of the first plug is different from a level of the bottom of the second plug in a direction approximate perpendicular to the substrate; and the third electrode layer is electrically connected with the first plug or the second plug.

19. The semiconductor structure according to claim 18, wherein:

the first electrode layer and the first portion of the bottom dielectric layer are arranged between the bottom of the first plug and the substrate; and the second electrode layer, the first dielectric layer, and the second portion of the bottom dielectric layer are arranged between the bottom of the second plug and the substrate.

20. The semiconductor structure according to claim 18, wherein:

when the third electrode layer is electrically connected with the first plug, a dimension of the first plug is larger than a dimension of the second plug in a plane parallel to the substrate; and when the third electrode layer is electrically connected with the second plug, the dimension of the second plug is larger than the dimension of the first plug in the plane parallel to the substrate.

* * * * *